United States Patent
Wang et al.

(10) Patent No.: US 12,314,193 B2
(45) Date of Patent: *May 27, 2025

(54) SCHEDULING OF READ OPERATIONS AND WRITE OPERATIONS BASED ON A DATA BUS MODE

(71) Applicant: Micron Technology, Inc., Boise, ID (US)

(72) Inventors: Wei Wang, Dublin, CA (US); Jiangli Zhu, San Jose, CA (US); Ying Yu Tai, Mountain View, CA (US); Samir Mittal, Palo Alto, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/531,642

(22) Filed: Dec. 6, 2023

(65) Prior Publication Data

US 2024/0104030 A1    Mar. 28, 2024

Related U.S. Application Data (63) Continuation of application No. 17/112,748, filed on Dec. 4, 2020, now Pat. No. 11,874,779, which is a
(Continued)

(51) Int. Cl.
   *G06F 13/16*    (2006.01)
   *G06F 3/06*     (2006.01)
   *G11C 7/10*     (2006.01)

(52) U.S. Cl.
   CPC .......... *G06F 13/1642* (2013.01); *G06F 3/061* (2013.01); *G06F 3/0659* (2013.01);
   (Continued)

(58) Field of Classification Search
   None
   See application file for complete search history.

(56) References Cited

U.S. PATENT DOCUMENTS

| | | |
|---|---|---|
| 5,948,081 A | 9/1999 | Foster |
| 6,092,158 A | 7/2000 | Harriman et al. |
| | (Continued) | |

FOREIGN PATENT DOCUMENTS

| | | |
|---|---|---|
| CN | 1501254 A | 6/2004 |
| CN | 101667105 A | 3/2010 |
| | (Continued) | |

OTHER PUBLICATIONS

Extended European Search Report for European Application No. 19862712.7, mailed May 13, 2022, 12 Pages.
(Continued)

*Primary Examiner* — Farley Abad
*Assistant Examiner* — Dayton Lewis-Taylor
(74) *Attorney, Agent, or Firm* — LOWENSTEIN SANDLER LLP (57) ABSTRACT

A data bus coupled to a plurality of memory devices is determined to be in a read mode. Responsive to determining that the data bus is in the read mode, a particular read operation identified in a particular memory queue of memory queues that include identifiers of one or more write operations and identifiers of one or more read operations is determined. The particular memory queue includes a highest number of read operations for a memory device of the memory devices. The particular read operation is transmitted from the particular memory queue over the data bus.

20 Claims, 6 Drawing Sheets

Related U.S. Application Data continuation of application No. 16/132,875, filed on Sep. 17, 2018, now Pat. No. 10,877,906.

(52) U.S. Cl.
CPC .......... *G06F 3/0671* (2013.01); *G11C 7/1045* (2013.01); *G06F 2213/16* (2013.01)

(56) References Cited

U.S. PATENT DOCUMENTS

| | | |
|---|---|---|
| 6,564,304 B1 | 5/2003 | Van Hook et al. |
| 6,799,283 B1* | 9/2004 | Tamai ................. G06F 11/1088 |
| 7,047,374 B2 | 5/2006 | Sah et al. |
| 7,538,772 B1 | 5/2009 | Fouladi et al. |
| 9,245,496 B2* | 1/2016 | Gruber ................... G09G 5/395 |
| 10,585,623 B2* | 3/2020 | Lo ......................... G06F 3/0673 |
| 2003/0088751 A1 | 5/2003 | Wu et al. |
| 2003/0163654 A1 | 8/2003 | Louzoun et al. |
| 2003/0177320 A1 | 9/2003 | Sah et al. |
| 2005/0246481 A1 | 11/2005 | Rohit et al. |
| 2013/0061010 A1 | 3/2013 | Venkatramani et al. |
| 2018/0232311 A1 | 8/2018 | Bhati et al. |
| 2019/0196995 A1* | 6/2019 | Shen ..................... G06F 3/0673 |

FOREIGN PATENT DOCUMENTS

| | | |
|---|---|---|
| CN | 101989241 A | 3/2011 |
| CN | 103543954 A | 1/2014 |
| CN | 107992436 A | 5/2018 |
| KR | 100531324 B1 | 11/2005 |
| KR | 20170136382 A | 12/2017 |
| WO | 2013032816 A1 | 3/2013 |

OTHER PUBLICATIONS

International Search Report and Written Opinion for International Application No. PCT/US2019/051579, mailed Jan. 3, 2020, 9 Pages.

Office Action for Chinese Patent Application No. 20198064724.3, mailed Aug. 31, 2023, 12 Pages.

Office Action for Korean Application No. 10-2021-7011100, mailed May 15, 2023, 5 Pages.

\* cited by examiner

SCHEDULING OF READ OPERATIONS AND WRITE OPERATIONS BASED ON A DATA BUS MODE

RELATED APPLICATIONS

This application is a continuation application of co-pending U.S. patent application Ser. No. 17/112,748, filed Dec. 4, 2020, which is a continuation application of U.S. patent application Ser. No. 16/132,875, filed Sep. 17, 2018, now U.S. Pat. No. 10,877,906, issued Dec. 29, 2020, which are all hereby incorporated by reference in their entirety herein.

TECHNICAL FIELD

The present disclosure generally relates to a memory sub-system, and more specifically, relates to the scheduling of read operations and write operations based on a data bus mode in memory sub-systems.

BACKGROUND

A memory sub-system can be a storage system, such as a solid-state drive (SSD), or a hard disk drive (HDD). A memory sub-system can be a memory module, such as a dual in-line memory module (DIMM), a small outline DIMM (SO-DIMM), or a non-volatile dual in-line memory module (NVDIMM). A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various implementations of the disclosure.

DETAILED DESCRIPTION

Aspects of the present disclosure are directed to the scheduling of read operations and write operations based on a data bus mode. A memory sub-system is also hereinafter referred to as a "memory device." An example of a memory sub-system is a storage device that is coupled to a central processing unit (CPU) via a peripheral interconnect (e.g., an input/output bus, a storage area network). Examples of storage devices include a solid-state drive (SSD), a flash drive, a universal serial bus (USB) flash drive, and a hard disk drive (HDD). Another example of a memory sub-system is a memory module that is coupled to the CPU via a memory bus. Examples of memory modules include a dual in-line memory module (DIMM), a small outline DIMM (SO-DIMM), a non-volatile dual in-line memory module (NVDIMM), etc. In some embodiments, the memory sub-system can be a hybrid memory/storage sub-system. In general, a host system can utilize a memory sub-system that includes one or more memory components. The host system can provide data to be stored at the memory sub-system and can request data to be retrieved from the memory sub-system.

In a conventional memory sub-system, read operations and write operations that are received from the host system can be placed into a command queue. The conventional memory sub-system can include a data bus (i.e., an interface) that is used to transmit the read operations and write operations to different partitions of the memory sub-system. A partition of the memory sub-system can be one or more memory components (i.e., memory dies). Thus, the data bus can couple the command queue with multiple partitions in order to transmit data to and from memory components of the partitions.

The conventional memory sub-system can transmit and receive data via the data bus by implementing a bus protocol based on requirements of the data bus and the memory components. For example, when a command is transmitted over the data bus to one of the memory components in one of the partitions, a particular amount of time should elapse before a subsequent operation (e.g., a next read operation or a write operation) can be transmitted to the same partition. Additionally, if a first portion of a memory component is included in a first partition and a second portion of the memory component is included in a second partition and if the first portion of the memory component included in the first partition receives an operation, then a particular amount of time should elapse before a subsequent operation (e.g., a next read operation or a next write operation) can be transmitted to the second portion of the memory component that is included in the second partition. Additionally, the utilization of the data bus can further be based on characteristics of the memory components. For example, for a conventional memory sub-system that utilizes cross point array based memory components, different amounts of time can elapse between a transmitting of a read operation and a transmitting of a write operation (e.g., different read and write latencies). Other requirements of the bus protocol can include an amount of elapsed time (i.e., a turnaround) for the data bus when transmitting separate write operations or read operations and an amount of elapsed time between utilizing the data bus to perform read operations at different memory components (e.g., different memory die). As such, the implementation of the bus protocol to control the transmitting and receiving of data from read operations and write operations over the data bus can result in a particular amount of time where the data bus is not being used to transmit or receive data (e.g., the bus protocol enforces a particular time to elapse between operations). For example, if the conventional memory sub-system is to perform a read operation followed by a write operation (or vice versa), then the switch between performing the read operation and performing the write operation can result in an amount of time where the utilization of the data bus is reduced.

Advantages of the present disclosure address the above and other deficiencies by scheduling read operations and write operations based on a data bus mode to reduce the number of switches from read operations to write operations or from write operations to read operations. A data bus mode can specify a prior operation that was transmitted over the data bus. For example, the data bus mode can specify a read mode if the last operation that was transmitted over the data bus was a read operation or the data bus mode can specify a write mode if the last operation that was transmitted over the data bus was a write operation. The scheduling of read operations and write operations can be based on reducing the number of times that the data bus mode switches between the read mode and the write mode.

If the data bus is at a read mode, then a read operation from an available partition queue (i.e., the portion of the command queue corresponding to an available partition) that includes the most number of read operation for the current working memory component or memory die can be selected. The current working memory component can be the prior memory component (or memory die) that was subjected to the prior read operation. Furthermore, the partition queue can be considered to be available if an operation can be provided to the corresponding partition while satisfying requirements of the bus protocol. If a read operation in an available partition queue is identified for the current working memory component, then the read operation can be transmitted over the data bus. Otherwise, if such a read operation cannot be identified for any available partition queues associated with the current working memory component, then a read operation in an available partition queue with the most number of read operations for any memory component can be identified and transmitted over the data bus. However, if no such read operation can be identified in any available partition queue, then a write operation from an available partition queue with the most number of write operations on any of the memory components can be identified and transmitted over the data bus. Thus, the data bus can switch from the read mode to the write mode.

If the data bus is in the write mode, then a write operation from an available partition queue with the most number of write operations on any memory component can be transmitted. If such a write operation is not identified, then the data bus can remain in the write mode or switch to the read mode based on an indication of a number of partitions that are associated with write operations. For example, the indication can identify a number of partition queues that include write operations. If the number of partition queues with write operations satisfies a threshold condition, then the data bus can remain in the write mode until a write operation is transmitted over the data bus. Otherwise, a read operation in the partition queue with the most number of read operations on any memory component can be retrieved and transmitted by the data bus.

Advantages of the present disclosure include, but are not limited to, an increased performance of a memory sub-system. For example, since the throughput of the bus of the memory sub-system can be increased by reducing the number of times that the data bus mode switches between read modes and write modes, the memory sub-system can be capable of performing more write operations and read operations at the memory components included in the memory sub-system.

Figure 1:
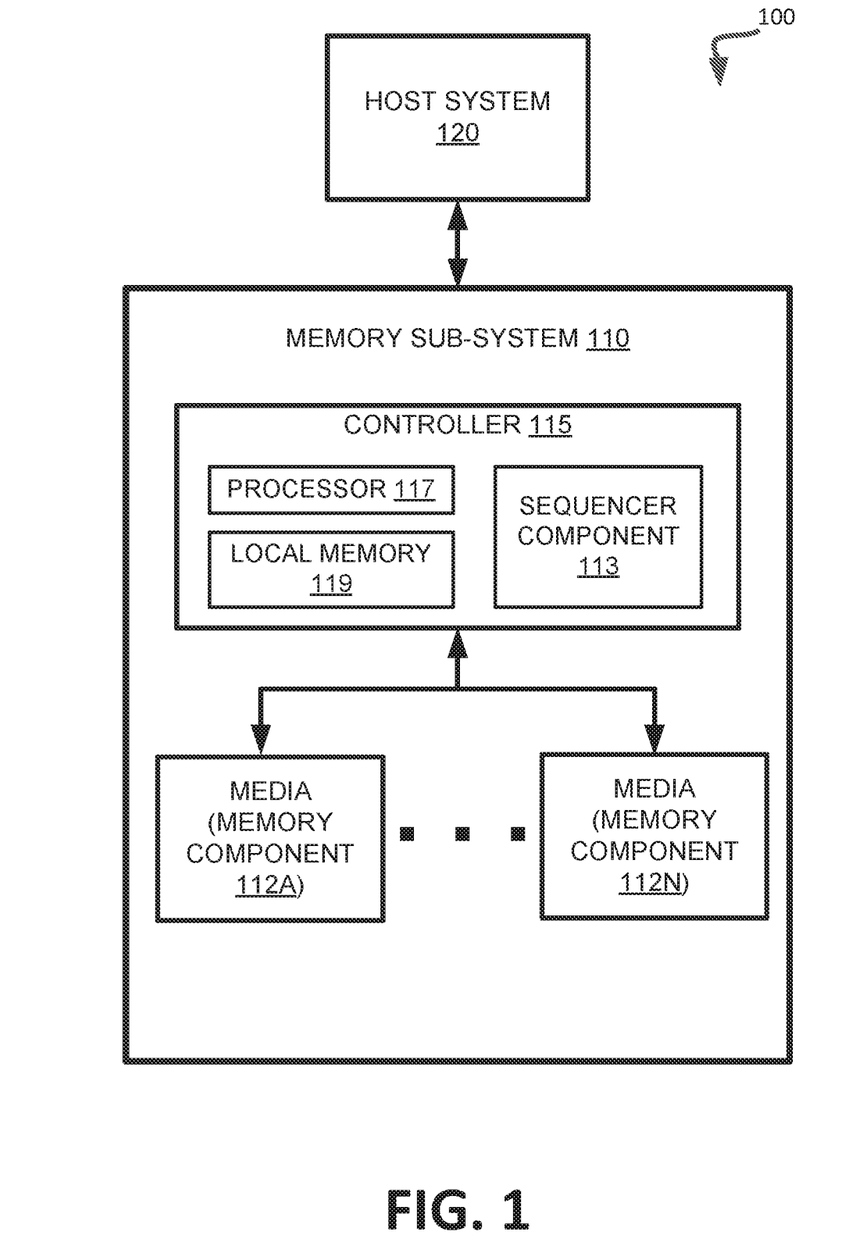
FIG. 1 illustrates an example computing environment that includes a memory sub-system in accordance with some embodiments of the present disclosure.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array.

Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a sequencer component 113 that can be used to issue read operations or write operations. In some embodiments, the controller 115 includes at least a portion of the sequencer component 113. For example, the controller 115 can include a processor 117 (processing device) configured to execute instructions stored in local memory 119 for performing the operations described herein. In some embodiments, the sequencer component 113 is part of the host system 110, an application, or an operating system.

The sequencer component 113 can transmit read operations and write operations to the memory components 112A to 112N by utilizing a data bus (i.e., an interface) of the memory sub-system 110. The scheduling component 113 can determine particular operations at particular partition queues that can be retrieved and transmitted over the data bus to the various memory components 112A to 112N that correspond to different partitions. Further details with regards to the operations of the sequencer component 113 are described below.

Figure 2:
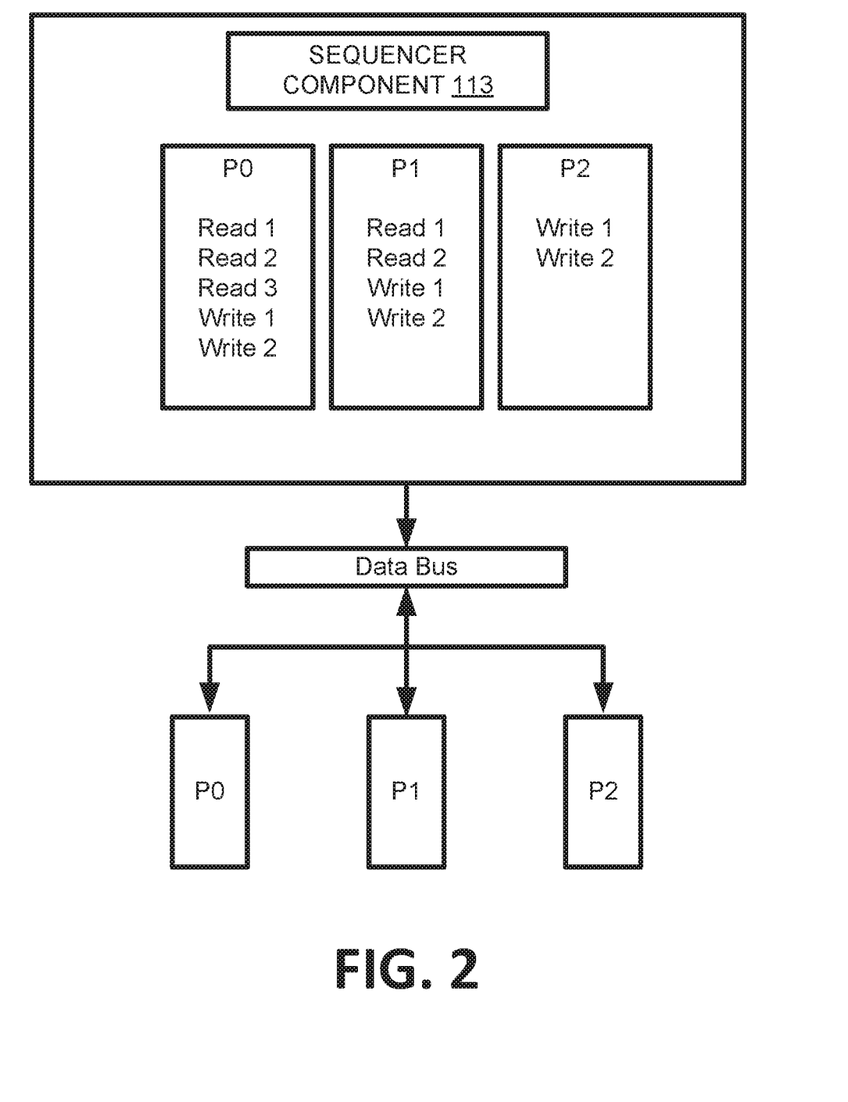
FIG. 2 illustrates an example scheduling of operations in accordance with some embodiments of the present disclosure.

FIG. 2 illustrates an example scheduling of operations in accordance with some embodiments of the present disclosure. As shown, the sequencer component 113 can identify read operations and write operations in different partition queues and can transmit the read operations and write operations over a data bus to different partitions. The partition queues P0, P1, and P2 can correspond to a command queue of a memory sub-system. The partition queue P0 can include operations that are to read or write data at the partition P0, the partition queue P1 can include operations that are to read or write data at the partition P1, and the partition queue P2 can include operations that are to read or write data at the partition P2. The sequencer component 113 can identify a particular read operation or a write operation from any of the partition queues that can be transmitted over the data bus to the partitions P0, P1, and P2. As described in further detail below, the sequencer component 113 can identify a particular read operation or a particular write operation from a particular partition queue and can transmit the identified operation over the data bus.

Figure 3:
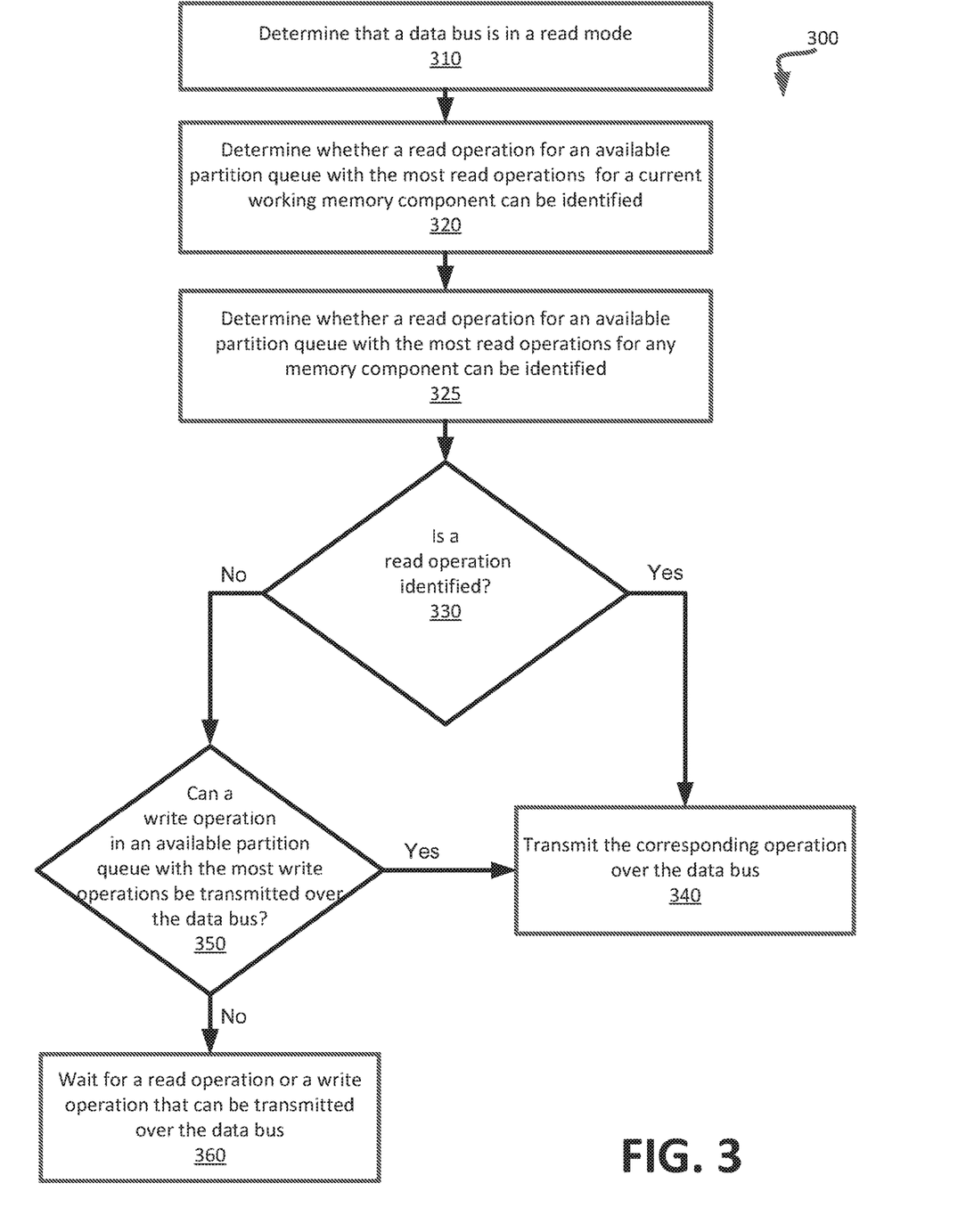
FIG. 3 is a flow diagram of an example method to schedule the issuance of operations when a data bus is in a read mode in accordance with some embodiments.

FIG. 3 is a flow diagram of an example method 300 to schedule the issuance of operations when a data bus is in a read mode in accordance with some embodiments. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the sequencer component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 3, at operation 310, a processing device determines that a data bus is in a read mode. The data bus can be considered to be in a read mode when a read operation was the prior (i.e., the last) operation that was transmitted over the data bus. In some embodiments, if no operation has been transmitted over the data bus, then the data bus can be considered to be in the read mode. At operation 320, the processing device determines whether a read operation for an available partition queue with the most number of read operations for a current working memory component can be identified and/or, at operation 325, the processing device determines whether a read operation for an available partition queue with the most number of read operations for any memory component can be identified. At operation 330, the processing device determines whether a read operation is identified. If a read operation is identified, then at operation 340, the processing device transmits the read operation over the data bus to the corresponding memory component that is associated with the available partition queue of the read operation. In some embodiments, if a read operation is identified at an available partition queue with the most number of read operations for the current working memory component, then the read operation that is transmitted is the read operation for the current working memory component. In the same or alternative embodiments, if no read operation is identified at an available partition queue for the current working memory component, then another read can be identified at an available partition queue with the most number of read operations for any memory component. Subsequently, the read operation can be transmitted. As such, if a read operation is present at an available partition queue and is to retrieve data at the current working memory component, then such a read operation can be transmitted over the data bus before a read operation that is present in an available partition queue that is to retrieve data at another memory component that is different than the current working memory component.

Referring to FIG. 3, if the read operation is not identified at operation 330, then the processing device determines whether a write operation in an available partition queue with the most write operations can be transmitted over the data bus. For example, if multiple write operations in multiple available partition queues are present, then a write operation at the available partition queue with the highest number of write operations (relative to other available partition queues) can be identified. For example, at operation 340, the processing device transmits the write operation over the data bus. Otherwise, if a write operation in an available partition queue is not identified, then at operation 360, the processing device waits for a read operation or a write operation that can be transmitted over the data bus. For example, the processing device can return to operation 310.

As such, if the data bus is in a read mode, a determination can be made as to whether any available partition queue includes a read operation for a current working memory component. If such a read operation is identified, then the read operation from the available partition queue with the most read operations for the current working memory component can be transmitted over the data bus. Otherwise, if such a read operation is not identified, then a determination can be made as to whether any available partition queue includes a read operation for any memory component. If such a read operation is identified, then a read operation from an available partition queue with the most read operations for any memory component can be transmitted over the data bus. Otherwise, a write operation can be transmitted over the data bus. For example, a write operation in an available partition queue that includes the most write operations on any memory component can be transmitted over the data bus.

Figure 4:
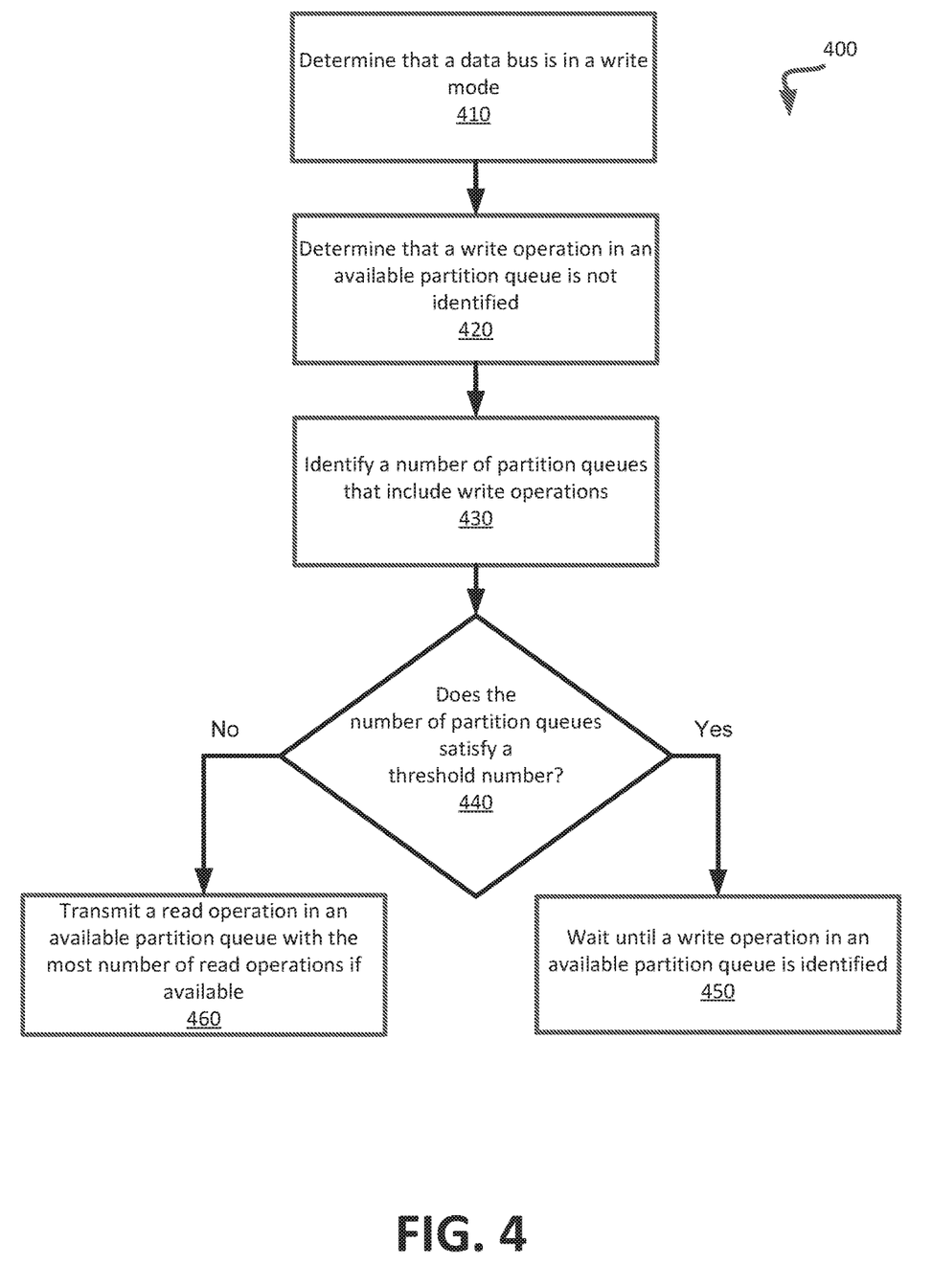
FIG. 4 is a flow diagram of an example method to schedule the issuance of operations when a data bus is in a write mode in accordance with some embodiments.

FIG. 4 is a flow diagram of an example method 400 to schedule the issuance of operations when a data bus is in a write mode in accordance with some embodiments. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the sequencer component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 4, at operation 410, a processing device determines that a data bus is in a write mode. The data bus can be considered to be in a write mode when a write operation was the prior (i.e., the last) operation that was transmitted over the data bus. At operation 420, the processing device determines that a write operation in an available partition queue is not identified. For example, a write operation is not present in any available partition queue. In some embodiments, if a write operation is present in multiple partition queues, then the write operation that is present in the available partition queue with the most write operations can be transmitted over the data bus. At operation 430, the processing device identifies a number of partition queues that include write operations. At operation 440, the processing device determines whether the number of partition queues exceeds a threshold number of partition queues. The number of partition queues can be considered to exceed the threshold number of partition queues when the number of partition queues is equal to or exceeds the threshold number. If the number of partition queues satisfies the threshold number, then, at operation 450, the processing device waits until a write operation in an available partition queue is identified. For example, the processing device can pause transmitting an operation over the data bus until a partition queue with a write operation becomes available and then the write operation can be transmitted over the data bus. Otherwise, if the number of partition queues does not satisfy the threshold number, then, at operation 460, the processing device transmits a read operation in a partition queue with the most read operations if such a read operation is available. For example, the read operation can be transmitted over the data bus. Otherwise, if the read operation is not available, then the processing device waits to transmit an operation and returns to operation 410.

As such, when a data bus is in the write mode, a write operation in the available partition queue with the most write operations on any memory component can be transmitted over the data bus. Otherwise, a read operation or a write operation is transmitted over the data bus based on a number of partition queues that include a write operation.

Figure 5:
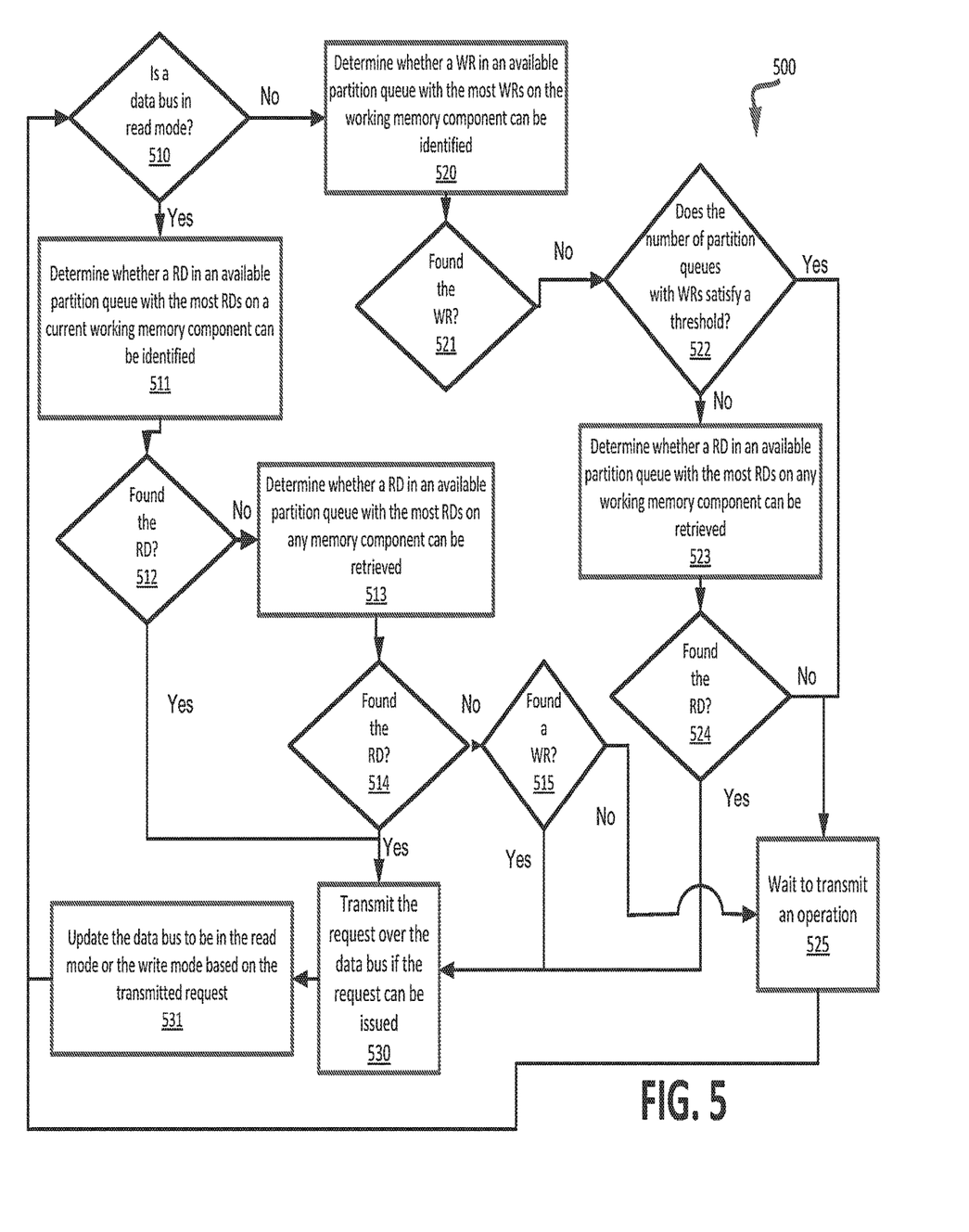
FIG. 5 is a flow diagram of an example method to schedule read operations and write operations in accordance with some embodiments of the present disclosure.

FIG. 5 is a flow diagram of an example method 500 to schedule read operations and write operations in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the sequencer component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 5, at operation 510, a processing device determines whether a data bus is in a read mode. The data bus can be in a read mode when the prior operation that was transmitted over the data bus to a partition was a read operation. Otherwise, if the prior operation (i.e., the last operation) that was transmitted over the data bus was a write operation, then the data bus can be determined to be in a write mode. At operation 511, the processing device determines whether a read operation (RD) in an available partition queue with the most number of read operations on a current working memory component can be identified. A partition queue can be considered to be available when transmitting an operation to the partition queue satisfies the data bus protocol requirements. For example, a partition queue can be considered to be available when transmitting a read operation or write operation for the partition queue over the data bus would not violate any of the requirements of the data bus protocol. Otherwise, the partition queue can be considered to be unavailable when transmitting such operations for the partition queue over the data bus would violate at least one requirement of the data bus protocol. The current working memory component can refer to the memory component that includes the partition specified by or associated with the last or prior operation transmitted over the data bus. At operation 512, the processing device determines whether such a read operation is found. For example, a read operation that is specifying a partition that is included in the working memory component can be identified. If such a read operation is found or identified, then at operation 514, the processing device transmits the read operation over the data bus if the request can be issued. In some embodiments, the read operation can be issued over the data bus if the data bus is not currently transmitting another command. The read operation can then be transmitted after the data bus becomes available. In some embodiments, if the read operation cannot be issued, then the processing device waits to transmit an operation as specified by operation 525. Otherwise, if such a read operation cannot be found at operation 512, then at operation 513, the processing device determines whether a read operation in an available partition queue with the most number of read operations on any memory component can be retrieved. At operation 514, the processing device determines whether such a read operation can be found. For example, the determination can be whether any partition queue includes at least one read operation. If such a read operation can be found, then at operation 530, then the processing device transmits the read operation over the data bus if the read operation can be transmitted. Otherwise, at operation 515, if the read operation at operation 514 is not found, then the processing device determines whether a write operation can be found. For example, a determination can be made as to whether any available partition queue includes a write operation and the partition queue with the most number of write operations can be identified. A particular write operation from the write operations in the identified partition queue can then be selected. In some embodiments, the write operation that is oldest (e.g., earliest issued by a host system) can be selected. If such a write operation is found, then at operation 530, the processing device transmits the write operation over the data bus if the write operation can be issued. Otherwise, at operation 525, the processing device waits to transmit an operation. For example, the processing device can wait until a write operation at an available partition queue can be identified. After an operation has been issued at operation 530, the processing device updates, at operation 531, the data bus to be in the read mode or the write mode based on the transmitted operation. For example, the data bus can remain or be changed to be in the read mode if the last operation that was transmitted over the data bus was a read operation (i.e., a read operation) and the data bus can remain or be changed to be in the write mode if the last operation that was transmitted over the data bus was a write operation (i.e., a write operation). Subsequently, at operation 510, the processing device determines whether the data bus is in the read mode as previously described.

Referring to FIG. 5, if at operation 510 the processing device determines that the data bus is not in a read mode, then the data bus can be in the write mode. At operation 520, the processing device determines whether a write operation in an available partition queue with the most write operations on the working memory component can be identified. At operation 521, a determination is made as to whether the write operation is found. If the write operation is found, then the write operation can be transmitted over the data bus if the write operation can be issued (at operation 530). Otherwise, if the write operation is not found, then, at operation 522, the processing device determines whether a number of partition queues with write operations satisfy a threshold number of partition queues. The number of partition queues can satisfy the threshold number of partition queues when the number of partition queues that includes at least one write operation is the same as or exceeds the threshold number of partition queues. If the number of partition queues with write operations satisfies the threshold, then at operation 525, the processing device waits to transmit an operation. For example, the processing device can wait until a partition queue with at least one write operation becomes available and can be transmitted over the data bus. Otherwise, if the number of partition queues with write requests does not satisfy the threshold, then at operation 523, the processing device determines whether a read operation in an available partition queue with the most read operations on any working memory component can be retrieved. At operation 524, the processing device determines whether such a read operation is found. If the read operation is not found, then at operation 525, the processing device waits to transmit an operation. Otherwise, if the read operation is found, then at operation 530, the read operation is transmitted over the data bus.

Figure 6:
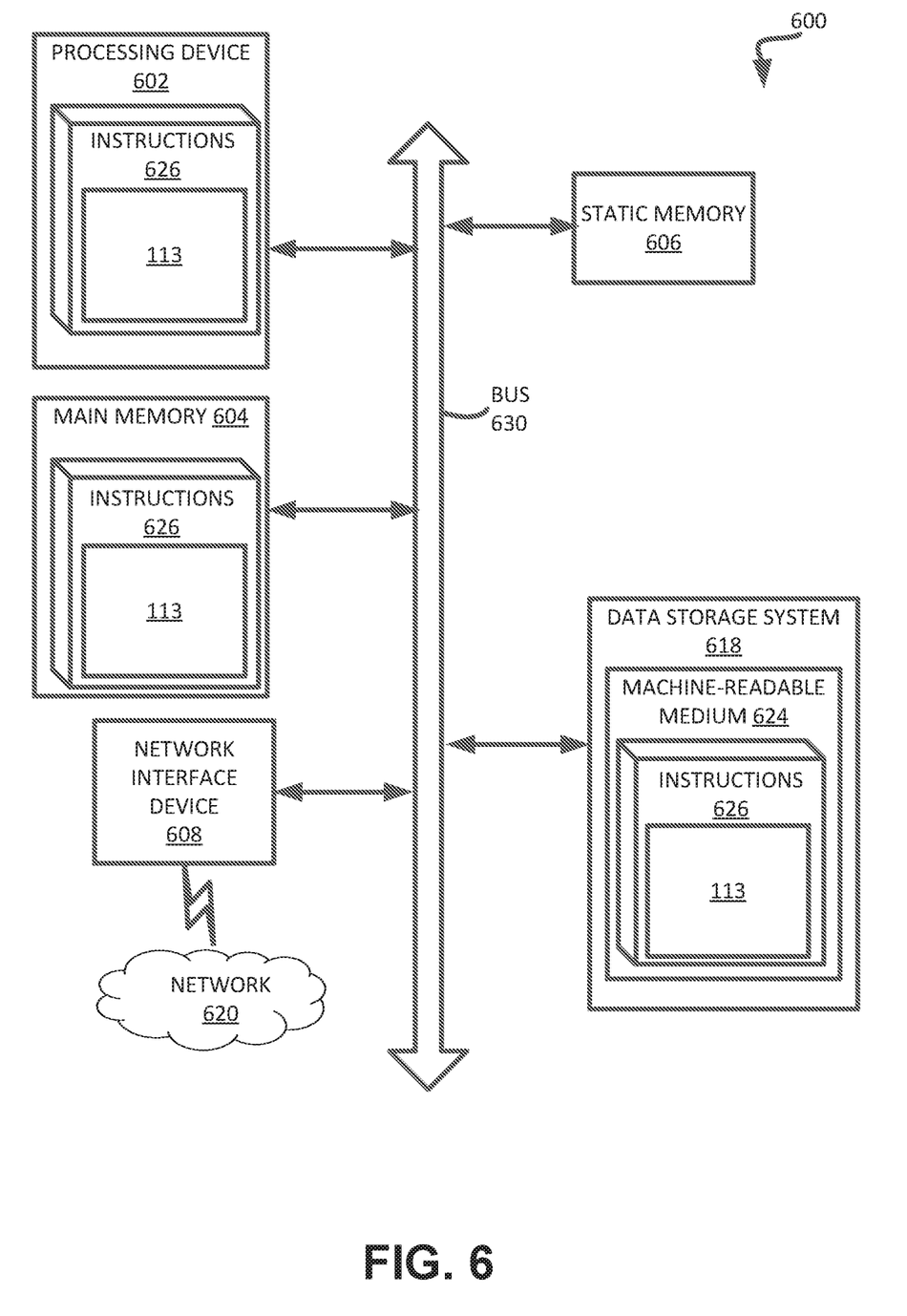
FIG. 6 is a block diagram of an example computer system in which implementations of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the sequencer component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a sequencer component (e.g., the sequencer component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
    a plurality of memory devices; and
    a processing device, operatively coupled with the plurality of memory devices, to perform operations comprising:
        determining that a data bus coupled to the plurality of memory devices is in a read mode;
        responsive to determining that the data bus is in the read mode, evaluating a plurality of memory queues that comprise identifiers of one or more write operations and identifiers of one or more read operations to identify, among the plurality of memory queues, (i) a particular memory queue having a highest number of read operation identifiers for a memory device of the plurality of memory devices, and (ii) a particular read operation from the particular memory queue; and
        transmitting the particular read operation from the particular memory queue over the data bus.

2. The system of claim 1, wherein the memory device is a current working memory device that corresponds to a particular memory device specified by a prior operation transmitted over the data bus.

3. The system of claim 2, wherein the prior operation corresponds to a last operation that was transmitted over the data bus.

4. The system of claim 1, wherein determining that the data bus is in the read mode is based on a prior operation that was transmitted over the data bus.

5. The system of claim 1, wherein the particular memory queue is an available memory queue, and wherein the particular memory queue is the available memory queue when transmitting the particular read operation satisfies a data bus protocol.

6. The system of claim 1, wherein each memory queue of the plurality of memory queues corresponds to the plurality of memory devices, and wherein the data bus is coupled with the plurality of memory devices.

7. The system of claim 1, wherein the transmitting of the particular read operation from the particular memory queue over the data bus is based on a data bus protocol.

8. A method, comprising:
    determining, by a processing device, that a data bus coupled to a plurality of memory devices is in a read mode;
    responsive to determining that the data bus is in the read mode, evaluating a plurality of memory queues that comprise identifiers of one or more write operations and identifiers of one or more read operations to identify, among the plurality of memory queues, (i) a particular memory queue having a highest number of read operation identifiers for a memory device of the plurality of memory devices, and (ii) a particular read operation from the particular memory queue; and
    transmitting the particular read operation from the particular memory queue over the data bus.

9. The method of claim 8, wherein the memory device is a current working memory device that corresponds to a particular memory device specified by a prior operation transmitted over the data bus.

10. The method of claim 9, wherein the prior operation corresponds to a last operation that was transmitted over the data bus.

11. The method of claim 8, wherein determining that the data bus is in the read mode is based on a prior operation that was transmitted over the data bus.

12. The method of claim 8, wherein the particular memory queue is an available memory queue, and wherein the particular memory queue is the available memory queue when transmitting the particular read operation satisfies a data bus protocol.

13. The method of claim 12, wherein each memory queue of the plurality of memory queues corresponds to the plurality of memory devices, and wherein the data bus is coupled with the plurality of memory devices.

14. The method of claim 12, wherein the transmitting of the particular read operation from the particular memory queue over the data bus is based on a data bus protocol.

15. A non-transitory computer-readable storage medium comprising instructions, which when executed by a processing device, cause the processing device to perform operations comprising:
    determining that a data bus coupled to a plurality of memory devices is in a read mode;
    responsive to determining that the data bus is in the read mode, evaluating a plurality of memory queues that comprise identifiers of one or more write operations and identifiers of one or more read operations to identify, among the plurality of memory queues, (i) a particular memory queue including a highest number of read operation identifiers for a memory device of the plurality of memory devices, and (ii) a particular read operation from the particular memory queue; and
    transmitting the particular read operation from the particular memory queue over the data bus.

16. The non-transitory computer-readable storage medium of claim 15, wherein the memory device is a current working memory device that corresponds to a particular memory device specified by a prior operation transmitted over the data bus.

17. The non-transitory computer-readable storage medium of claim 15, wherein determining that the data bus is in the read mode is based on a prior operation that was transmitted over the data bus.

18. The non-transitory computer-readable storage medium of claim 15, wherein the particular memory queue is an available memory queue, and wherein the particular memory queue is the available memory queue when transmitting the particular read operation satisfies a data bus protocol.

19. The non-transitory computer-readable storage medium of claim 18, wherein each memory queue of the plurality of memory queues corresponds to the plurality of memory devices, and wherein the data bus is coupled with the plurality of memory devices.

20. The non-transitory computer-readable storage medium of claim 18, wherein the transmitting of the particular read operation from the particular memory queue over the data bus is based on a data bus protocol.

* * * * *